United States Patent [19]
Stark

[11] Patent Number: 6,122,208
[45] Date of Patent: Sep. 19, 2000

[54] CIRCUIT AND METHOD FOR COLUMN REDUNDANCY FOR HIGH BANDWIDTH MEMORIES

[75] Inventor: Donald C. Stark, Los Altos Hills, Calif.

[73] Assignee: Rambus Inc., Mountain View, Calif.

[21] Appl. No.: 09/398,252

[22] Filed: Sep. 17, 1999

[51] Int. Cl.$^7$ ...................................................... G11C 7/00
[52] U.S. Cl. ...................... 365/200; 365/189.12; 365/219
[58] Field of Search .............................. 365/200, 189.02, 365/220, 221, 219, 189.12, 230.02

[56] References Cited

U.S. PATENT DOCUMENTS

| | | | |
|---|---|---|---|
| 4,691,301 | 9/1987 | Anderson | 365/200 |
| 5,005,158 | 4/1991 | McClure et al. | 365/200 |
| 5,274,593 | 12/1993 | Proebsting | 365/200 |
| 5,497,353 | 3/1996 | Sato et al. | 365/230.05 |
| 5,768,196 | 6/1998 | Bloker et al. | 365/200 |
| 5,953,745 | 9/1999 | Lattimore et al. | 365/200 |

*Primary Examiner*—Son Mai
*Attorney, Agent, or Firm*—Pennie & Edmonds LLP

[57] ABSTRACT

A memory device includes a base memory with a defective memory cell. A read circuit with a serial output port and parallel input ports is connected to the base memory. The read circuit converts parallel read data received at the parallel input ports to a first serial data stream, which is applied to the serial output port. The first serial data stream includes a faulty bit corresponding to the defective memory cell. A spare memory stores a spare bit corresponding to the defective memory cell. A bit insertion circuit is connected to the spare memory and the serial output port of the read circuit. The bit insertion circuit substitutes the faulty bit value of the first serial data stream with the spare bit.

17 Claims, 6 Drawing Sheets

CIRCUIT AND METHOD FOR COLUMN REDUNDANCY FOR HIGH BANDWIDTH MEMORIES

BRIEF DESCRIPTION OF THE INVENTION

This invention relates generally to digital memory circuits. Specifically, the invention relates to a circuit and method for providing column redundancy for high bandwidth memories.

BACKGROUND OF THE INVENTION

A memory device including a memory core which is slow relative to output drivers and input receivers may use parallel to serial conversion for read operations and serial to parallel conversion for write operations. For example, assuming single data rate processing with eight bit shift registers, an output read shift register can be loaded in parallel once every eight bit times, with the resulting data shifted out onto the data bus one bit at a time. Similarly, an input write shift register can accumulate eight bits of incoming data, which are then presented to the memory core simultaneously. The conversions are used to match the relatively slow speed of the memory core with the higher speeds of the output drivers and input receivers. If the device uses double data rate processing, which transmits data on both edges of the clock, additional circuitry may be included to relax the timing requirements by separating even and odd data bits during read and write operations.

Typically, the memory device will have a certain number of address and control pins, used to transfer control and address information, and a certain number of data pins, used to transfer data between the memory and an external bus. Each data pin communicates via input/output (I/O) circuitry with the portion of the memory associated with the data pin. For a single data rate system, the I/O circuitry includes an input write shift register, an output read shift register, an input receiver, an output driver, and the read/write data lines between the shift registers and the memory. Each pair of read/write data lines is associated with a sub-portion of the memory. In the example discussed above, there would be eight pairs of read/write data lines between the portion of the memory associated with the data pin and the shift registers for each data pin. If there are eight data pins, the device will include 64 pairs of read/write data lines.

There exist various prior art schemes for compensating for damaged memory cells by providing redundant columns within the memory core. Cells within these redundant columns are used in place of damaged memory cells in regular (non-redundant) columns. In a memory device using serial-to-parallel conversion for write operations, and parallel-to-serial conversion for read operations, there are a large number of read/write data lines connected to the memory core. The redundancy scheme must be able to ensure that the correct data will be shifted out onto the bus at the appropriate time.

One common redundancy scheme is to add one or more spare columns in each sub-portion corresponding to a pair of read/write data lines. When there is a damaged cell within one of the regular columns in that sub-portion, the read from the damaged cell is suppressed, and the data is written to or read from the spare column instead. A disadvantage of this approach is that the redundancy address match and suppressing the access to the damaged cell location may limit column access time. Additionally, the number of spare columns required is relatively large, because each spare column can be used only within the sub-portion corresponding to a particular pair of read/write data lines. Therefore, the memory device will require at least one spare column for each pair of read/write data lines, and that will be insufficient if there is more than one failure in a sub-portion.

Another common redundancy scheme is to provide one or more spare columns in the array associated with each data pin. A multiplexor is included for each read/write data line, to substitute a cell of the spare column for a damaged cell in one of the regular columns in the sub-portion associated with that read/write data line. Use of the redundant columns is more flexible in this scheme, since a redundant column may be used for any read/write data line associated with a particular data pin. However, the wiring and multiplexing required is fairly substantial. Furthermore, the relatively high capacitance of the spare lines, due to their length, makes them slow to operate, potentially limiting column access time.

Thus, there a need in the art for a column redundancy scheme which is flexible, relatively fast, and does not require significant wiring and multiplexing.

SUMMARY OF THE INVENTION

The apparatus of the invention includes a base memory with a defective memory cell. A read circuit with a serial output port and parallel input ports is connected to the base memory. The read circuit converts parallel read data received at the parallel input ports to a first serial data stream, which is applied to the serial output port. The first serial data stream includes a faulty bit corresponding to the defective memory cell. A spare memory stores a spare bit corresponding to the defective memory cell. A bit insertion circuit is connected to the spare memory and the serial output port of the read circuit. The bit insertion circuit substitutes the faulty bit value of the first serial data stream with the spare bit.

The method of the invention includes the step applying a first serial data stream to a write circuit. The write circuit writes the serial data stream in parallel to a base memory. A selected bit of the first serial data stream is directly routed to a spare memory prior to applying the selected bit to the write circuit.

A benefit of the invention is its relative simplicity, with limited multiplexing and wiring being required compared to the prior art approach that uses multiplexors for each read/write data line. A further benefit is relative speed, because the wiring may be kept reasonably short with proper selection of spare column location. This combination of benefits is not provided by the prior art schemes for column redundancy.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
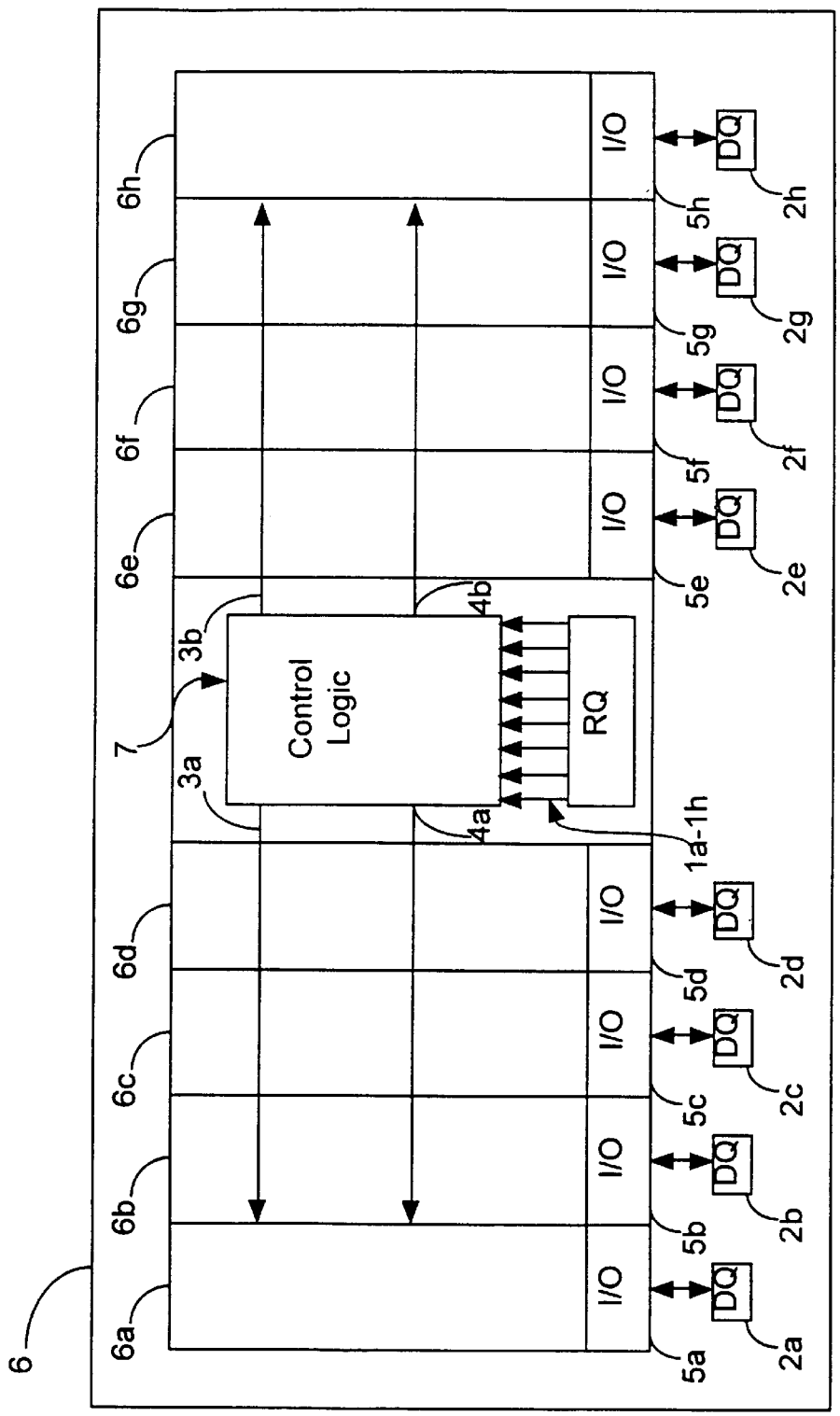
FIG. 1 illustrates the basic structure of a prior art high-speed memory device.

FIG. 1 illustrates an example of the basic structure of a high speed memory. In the example shown, eight control pins 1a–h are used to transfer control and address information between an external bus (not shown) and the memory device 6. Eight data pins 2a–2h transfer data between the external bus and the memory. A memory device may have more or fewer address and data pins depending on the required address and data bandwidth. Wires 3a–3b distribute row address information and wires 4a–4b distribute column address information from the control pins 1 via the control logic 7 to the entire memory 6a–6h. Each of the data pins 2 has I/O circuitry 5 associated with it, through which the data pins 2 communicate with the memory 6. The memory 6 includes portions of the memory 6a–6h, each of which is associated with one of the data pins 2a–2h.

Figure 2:
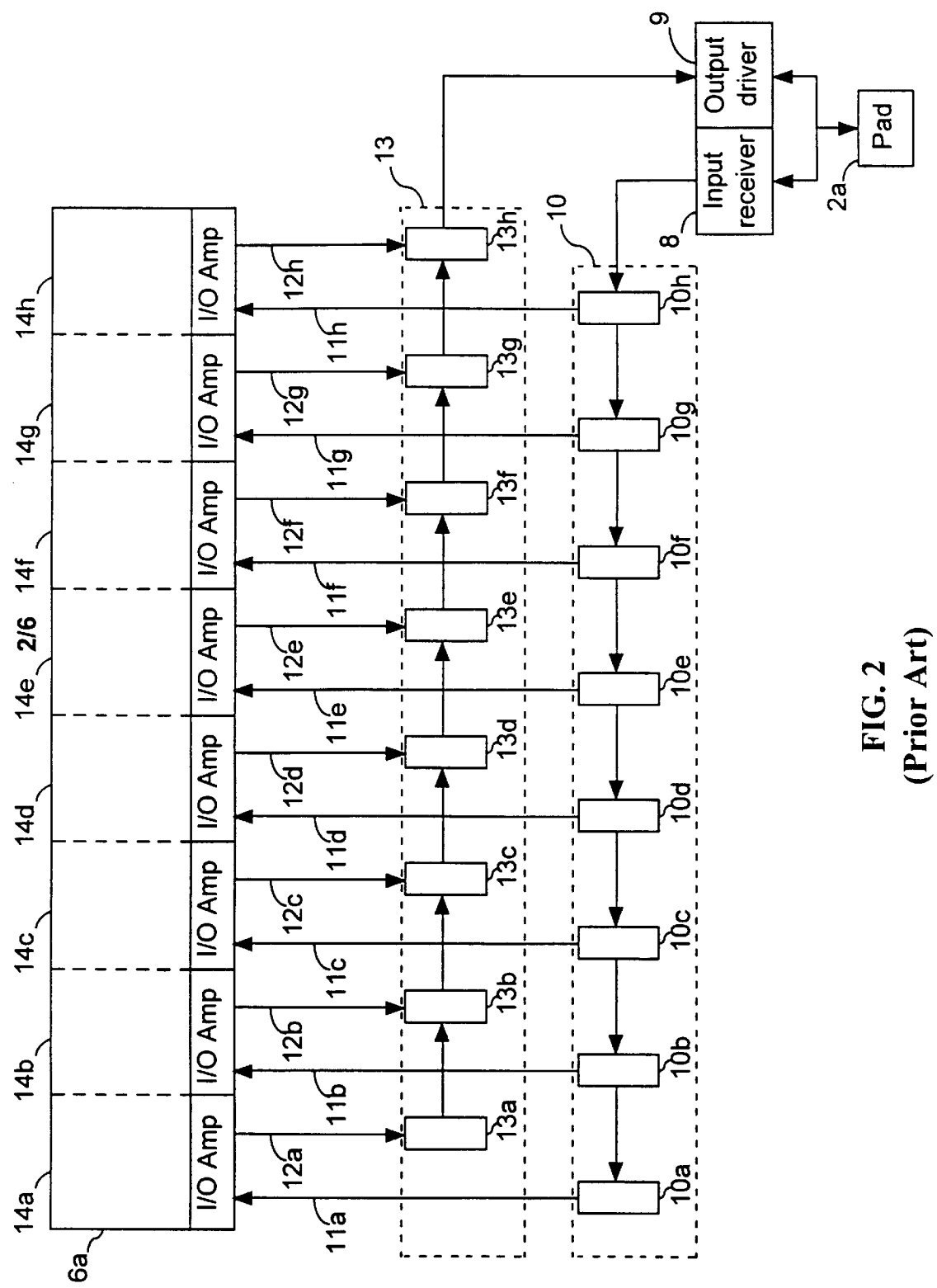
FIG. 2 illustrates the circuitry associated with a single data pin, including serial-to-parallel write circuitry and parallel-to-serial read circuitry, in accordance with the prior art.

FIG. 2 illustrates the basic structure of a single data pin and the circuitry used to communicate with the portion of the memory associated with the data pin in a single data rate system. The data pin 2a provides data to an input receiver 8 and receives data from an output driver 9. Data to be written to the portion of the memory 6a associated with the data pin 2a is provided serially to an input shift register 10 via the input receiver 8. The data is then presented to the portion of the memory 6a associated with the data pin 2a in parallel on the write data lines 11a–11h. Data being read from the portion of the memory 6a associated with the data pin 2a is read from the portion of the memory 6a on the parallel read data lines 12a–12h into the output shift register 13. The data is then shifted serially out to the data pin via the output driver 9.

Figure 3:
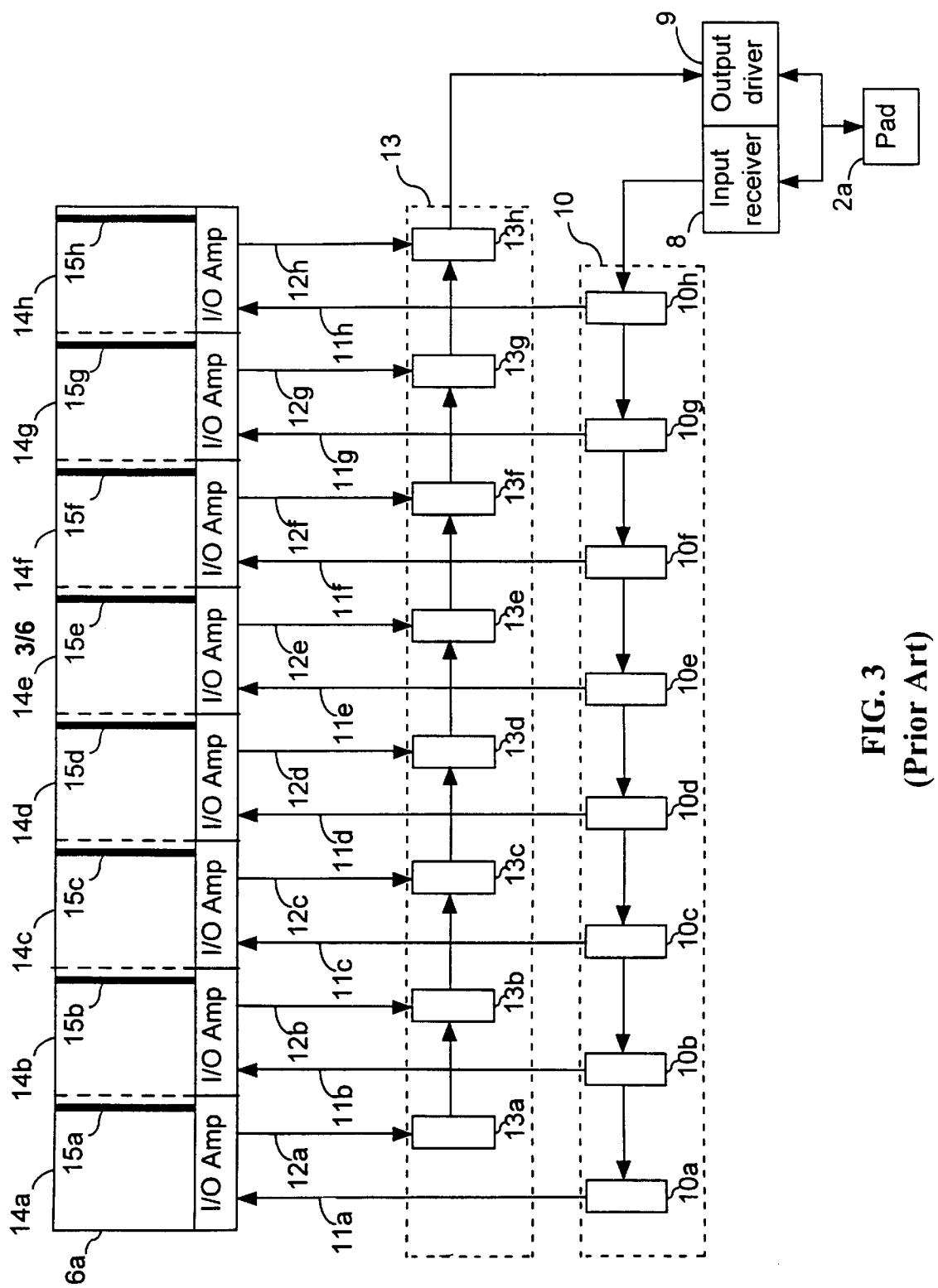
FIG. 3 illustrates the prior art approach to redundant columns using one spare column for each pair of read/write data lines.

Redundant columns of memory cells may be provided to be used as substitutes when memory cells in regular columns are damaged. FIG. 3 illustrates one prior art column redundancy scheme, in which one or more spare columns 15 is provided for each sub-portion 14 of the memory associated with each pair of read/write data lines 11–12. If a regular column in the sub-portion associated with a pair of read/write data lines includes a damaged cell, a spare column 15 is substituted for the regular column: read operations from the damaged cell, and write operations to the damaged cell are suppressed, and the data is written to and read from the corresponding cell in the spare column instead.

However, matching the addresses for the redundant column and suppressing access to the damaged cell location is relatively complex and consequently may limit the speed of the memory. Additionally, this approach requires a relatively large number of spare columns—at least one for each pair of read/write data lines. Furthermore, this may not be sufficient if there is more than one damaged cell within the memory associated with a single pair of read/write data lines.

Figure 4:
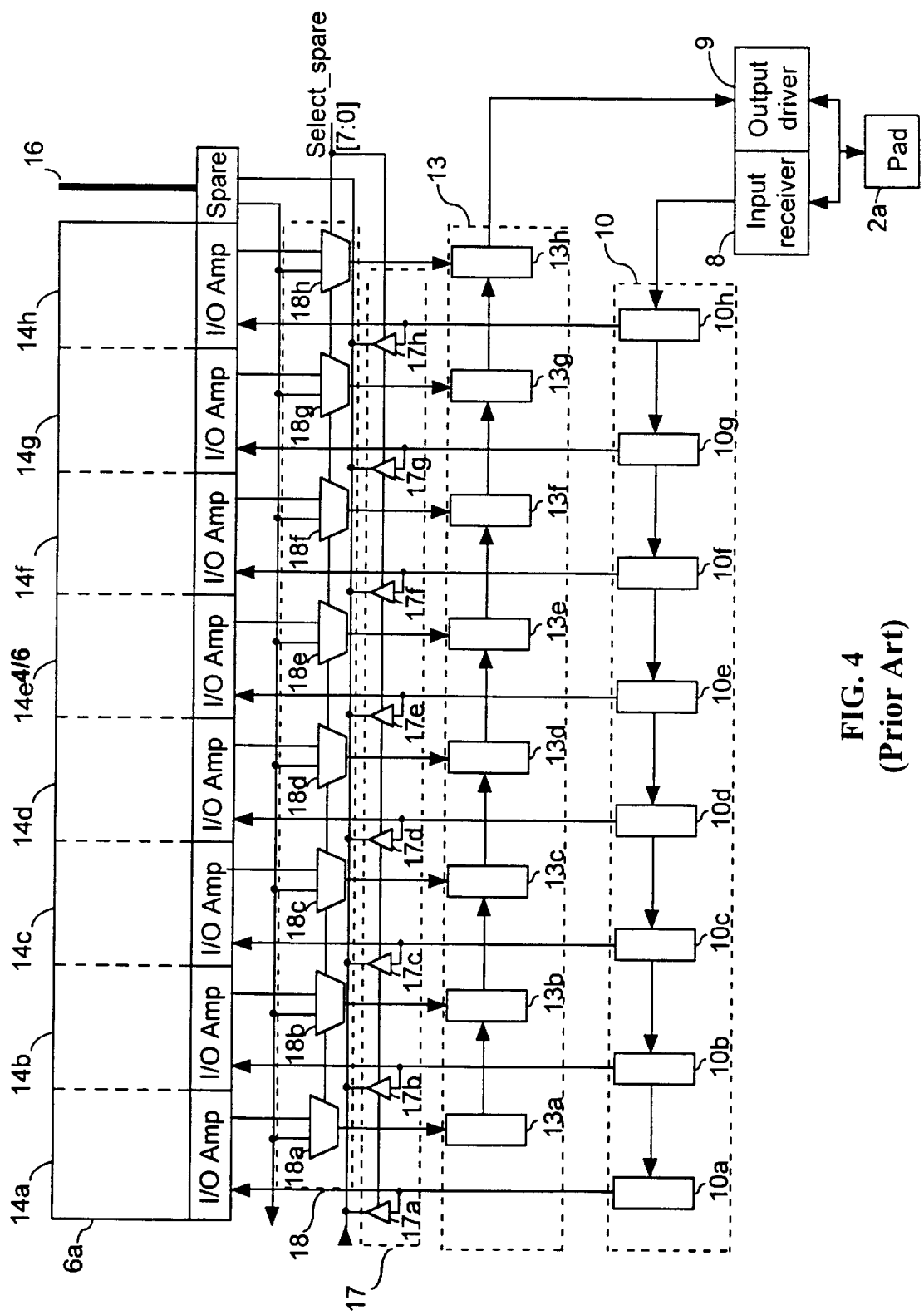
FIG. 4 illustrates the prior art approach to redundant columns using multiplexing between each pair of read/write data lines and the spare column(s).

Another prior art approach is illustrated in FIG. 4, in which one or more spare columns 16 are added in the portion of the memory 6a associated with each data pin 2a. An eight-to-one multiplexor 17, consisting of 8 tristate drivers 17a–17h, is placed between the input shift register 10 and the memory 6a. The input shift register 10 provides data to a regular column within the portion of the memory 6a associated with the data pin 2a. The multiplexor 17 selectively provides one data bit to a spare column 16. A sixteen-to-eight multiplexor 18, consisting of smaller two-to-one multiplexors 18a–18h, is placed between the output shift register 13 and memory 6a, so that the multiplexor 18 can select between reading data from a regular column and reading from a spare column 16. The multiplexors 17–18 enable data from a spare column to be multiplexed during read or write operations to a damaged cell, so that a cell in a spare column 16 can substitute for a damaged cell at any bit of the input shift register 10 or the output shift register 13. While this approach is more flexible and may require fewer spare columns than the approach illustrated in FIG. 3, the large number of multiplexors and the lengthy wires required add substantial complexity and delay.

Figure 5:
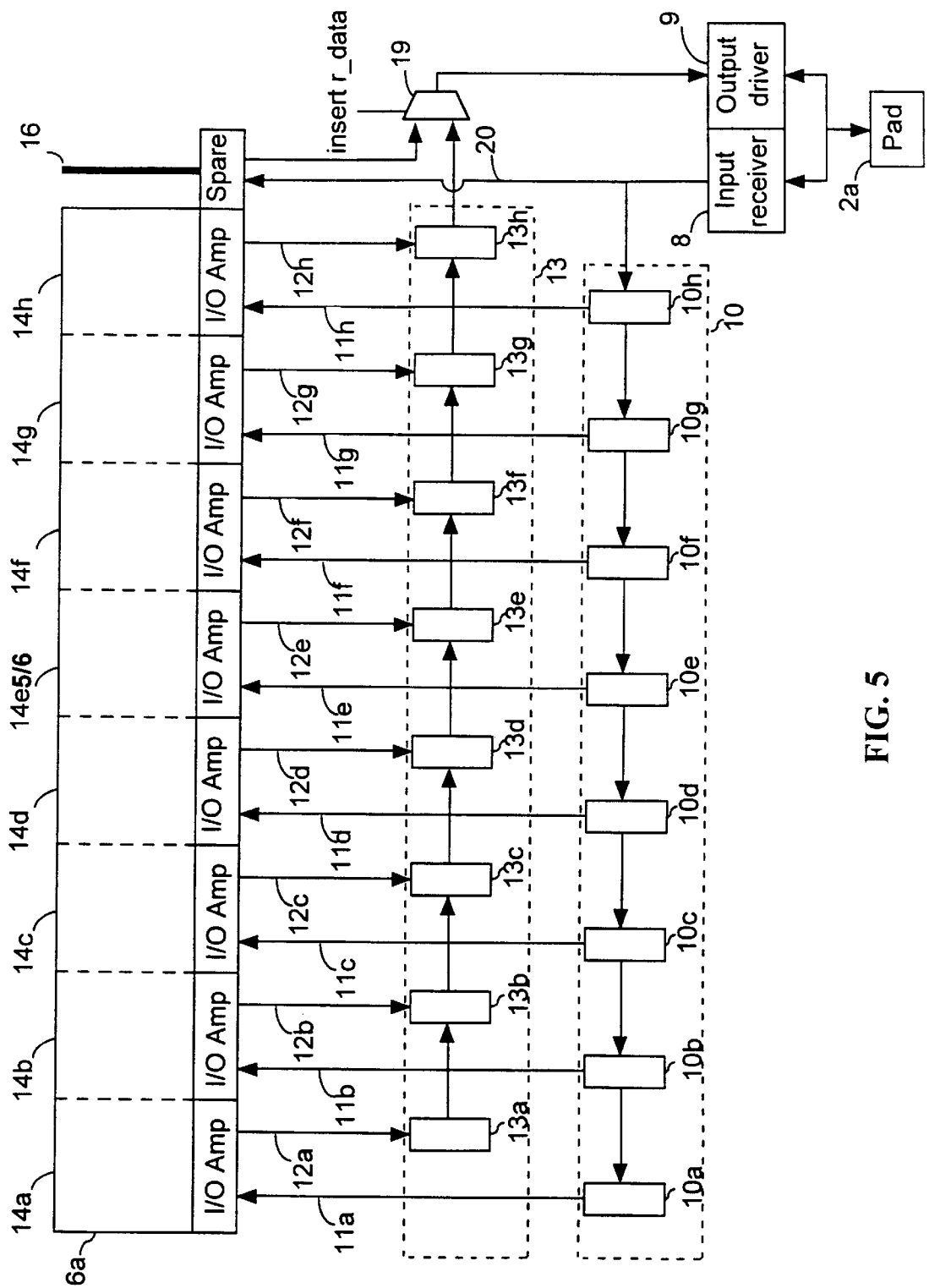
FIG. 5 illustrates a column redundancy scheme in accordance with an embodiment of the invention.

FIG. 5 illustrates one embodiment of the invention for a single data rate system, wherein data is transmitted on only one edge of the clock. As in the approach illustrated in FIG. 4, one or more spare columns 16 is included at the same place in the array 6a, preferably near the wires connecting the input shift register 10 to the input receiver 8 and the output shift register 13 to the output driver 9. A multiplexor 19 is provided between the spare columns 16 and the output driver 9. When data must be read from the spare column due to a damaged cell in a regular column, the multiplexor 19 selects the spare column 16 only for the bit time corresponding to the read from the damaged cell. In addition, a wire 20 is provided between the input receiver 8 and the spare column 16. When data must be written to the spare column 16, the incoming data is latched during the bit time when it passes the spare column 16.

Figure 6:
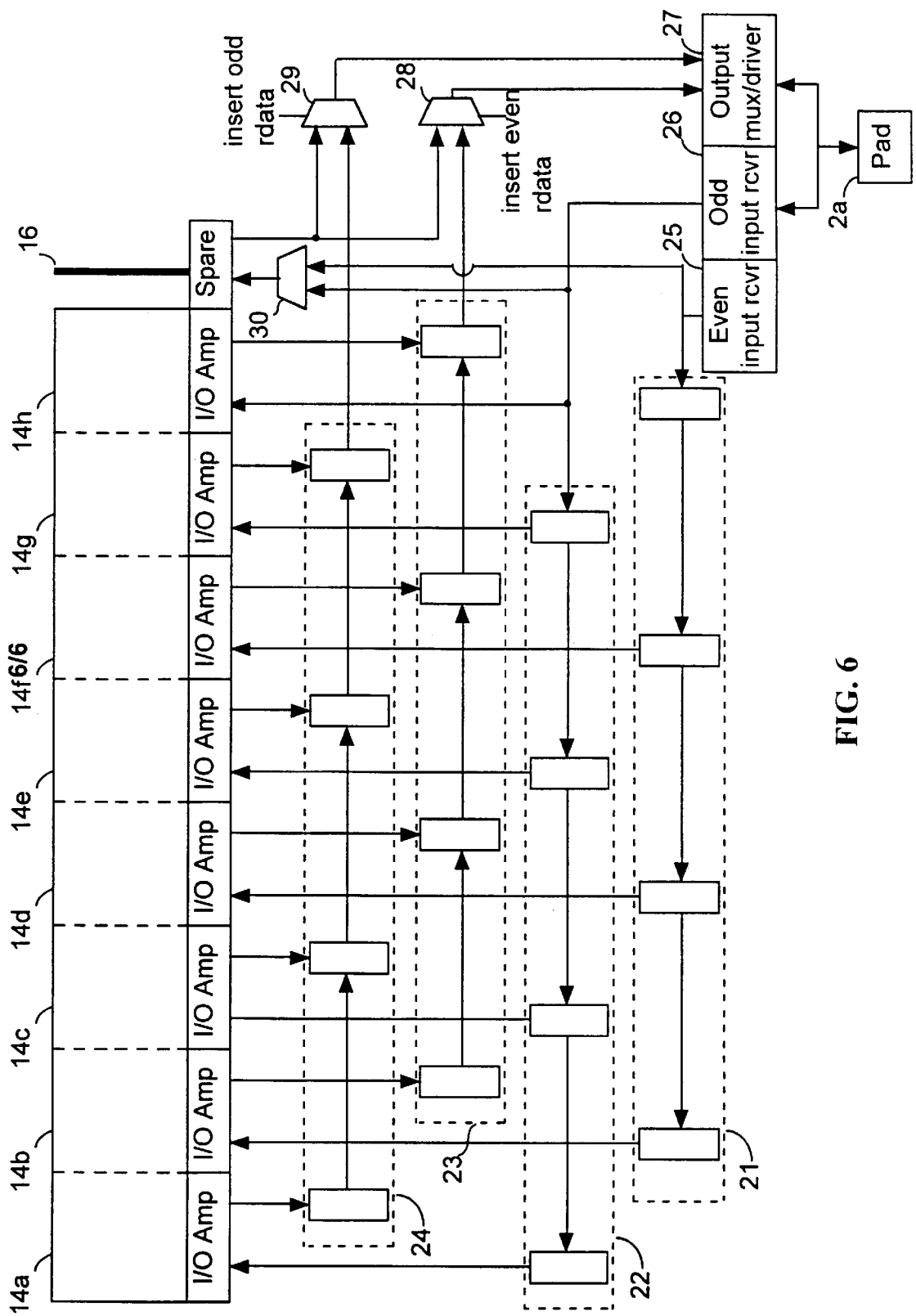
FIG. 6 illustrates a column redundancy scheme in accordance with an alternative embodiment of the invention.

This column redundancy scheme may be used for either single data rate systems, where data is transmitted on only one edge of the clock, or for double data rate systems, where data is transmitted on both edges of the clock. However, in a double data rate system, changes may be made to the input circuitry associated with each data pin to relax the timing requirements for the shifting circuitry. An embodiment of the invention for a double data rate system with modified input circuitry is illustrated in FIG. 6. The memory device includes an even input shift register 21 and an odd input shift register 22, as well as an even output shift register 23 and an odd output shift register 24. The even input shift register 21 inputs even bits which are transmitted relative to the rising edge of the clock, and the odd input shift register 22 inputs odd bits which are transmitted relative to the falling edge of the clock. Similarly, the even output shift register 23 outputs even bits, and the odd output shift register 24 outputs odd bits. An even input receiver 25 receives the even bits from the data pin 2a and provides them to the even input shift register 21, and an odd input receiver 26 receives the odd bits from the data pin 2a and provides them to the odd input shift register 22.

One or more spare columns 16 is included in the same place in the array 6a, preferably near the wires connecting the shift registers 21–24 with the input receivers 25–26 and the output multiplexor/driver 27. A multiplexor 28 multiplexes data from one or more spare columns 16 and the even output shift register 23, and permits data to be read from a spare column 16 if a cell in portion of the array associated with an even shift register bit is damaged. A second multiplexor 29 multiplexes data from one or more spare columns 16 and the odd output shift register 24, and permits data to be read from a spare column 16 if a cell in portion of the array associated with an odd shift register bit is damaged.

The output of the first multiplexor 28 and the second multiplexor 29 is provided to an output multiplexor and driver 27, which switches between accepting even bits from the first multiplexor 28 on the rising edge of the clock and accepting odd bits from the second multiplexor 29 on the falling edge of the clock. The output multiplexor and driver 27 provides the stream of alternating even and odd bits to the data pin 2a.

A third multiplexor 30 receives data from the even input receiver 25 and the odd input receiver 26. When, due to a damaged cell in a regular column, an even bit must be written to the spare column 16, the even bit is selected by the multiplexor 30 on the rising edge of the clock. The even bit is then latched into the spare column during the bit time before the even bit is to enter the even input shift register 21—that is, as the even bit passes the input of the multiplexor 30. Similarly, when an odd bit must be written to the spare column 16, it is selected by the multiplexor 30 on the falling edge of the clock and latched into the spare column during the bit time before the odd bit is to enter the odd input shift register 22.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown at the logic gate level in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, as obviously many modifications and variations are possible on view of the above teachings. The embodiments were chosen and described in order to best explain the principles of the invention and its practical applications, the thereby enable others skilled in the art to best utilize the invention and various embodiments with various modifications as are suited to the particular use contemplated. It is intended that the scope of the invention be defined by the following claims and their equivalents.

What is claimed is:

1. A memory device, comprising:
   a base memory with a defective memory cell;
   a read circuit with a serial output port and parallel ports connected to said base memory, said read circuit converting parallel read data received at said parallel ports to a first serial data stream applied to said serial output port, said first serial data stream including a faulty bit corresponding to said defective memory cell;
   a spare memory to store a spare bit corresponding to said defective memory cell; and
   a bit insertion circuit connected to said spare memory and said serial output port of said read circuit, said bit insertion circuit substituting said faulty bit value of said first serial data stream with said spare bit.

2. The memory device of claim 1 wherein said read circuit is a shift register.

3. The memory device of claim 1 wherein said bit insertion circuit is a multiplexer with a first input node connected to said serial output port of said read circuit and a second input node connected to said spare memory, said multiplexer selecting said first serial data stream at said first input node for a predetermined period of time and then selecting said spare bit at said second input node.

4. The memory device of claim 3 wherein said multiplexer is responsive to a select signal that inserts said spare bit into said first serial data stream at a select time corresponding to the serial bit position of said faulty bit.

5. The memory device of claim 1 further comprising an input receiver to selectively write said spare bit to said spare memory.

6. The memory device of claim 5 wherein said spare bit is selectively written to said spare memory at a select time corresponding to the location of the spare bit in a second serial data stream.

7. The memory device of claim 1 wherein said read circuit is an odd shift register with an odd serial output port and an even shift register with an even serial output port.

8. The memory device of claim 7 wherein said bit insertion circuit is a first multiplexor with a first input node connected to said odd serial output port and a second input node connected to said spare memory, and a second multiplexor with a third input node connected to said odd serial output port and a fourth input node connected to said spare memory, said first multiplexor selecting said first serial data stream at said first node on a first edge of a clock pulse for a first predetermined number of clock cycles and then selecting said spare bit at said second input node, and said second multiplexor selecting said first serial data stream at said third input node on a second edge of a clock pulse for a second predetermined number of clock cycles and then selecting said spare bit at said fourth input node.

9. The memory device of claim 8 wherein said first multiplexor is responsive to a first select signal that inserts said spare bit into said first serial data stream at a first edge of a clock of a select clock pulse cycle corresponding to the serial bit position of said faulty bit, and said second multiplexor is responsive to a second select signal that inserts said spare bit into said first serial data stream at a second edge of a clock of a select clock cycle corresponding to the serial bit position of said faulty bit.

10. The memory device of claim 8 further comprising
    a third multiplexor with an output node connected to said spare memory to selectively write said spare bit to said spare memory;
    an even input receiver with an output node connected to a first input node of said third multiplexor; and
    an odd input receiver with an output node connected to a second input node of said third multiplexor.

11. The memory device of claim 10 wherein said spare bit is selectively written to said spare memory at an edge of a select clock pulse corresponding to the location of the spare bit in a second serial data stream.

12. A method for providing redundancy in a memory, comprising:
    applying a first serial data stream to a write circuit;
    using said write circuit to write said first serial data stream in parallel to a base memory; and
    routing a selected bit of said first serial data stream directly to a spare memory prior to applying said selected bit to said write circuit.

13. The method of claim 12, wherein the routing step occurs in response to a select signal at a select clock cycle corresponding to the location of the defective memory cell.

14. The method of claim 13, wherein the routing step is responsive to a selected edge of a clock pulse.

15. The method of claim 12 further comprising:
    inserting the selected bit from the spare memory into a second serial data stream received from a read circuit.

16. The method of claim 15 wherein the inserting step occurs in response to a select signal at a select clock cycle corresponding to the location of a defective memory cell in said base memory.

17. The method of claim 15, wherein the inserting step is responsive to a selected edge of a clock pulse.

* * * * *